(12) United States Patent
Peters et al.

(10) Patent No.: US 6,225,680 B1
(45) Date of Patent: May 1, 2001

(54) SEMICONDUCTOR STRUCTURE BASED ON SILICON CARBIDE MATERIAL, WITH A PLURALITY ELECTRICALLY DIFFERENT PARTIAL REGIONS

(75) Inventors: Dethard Peters, Höchstadt; Reinhold Schörner, Grossenseebach, both of (DE)

(73) Assignee: SiCed Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/494,772

(22) Filed: Jan. 31, 2000

Related U.S. Application Data

(63) Continuation of application No. PCT/DE98/02108, filed on Jul. 27, 1998.

(30) Foreign Application Priority Data

Jul. 31, 1997 (DE) .............................................. 197 33 076

(51) Int. Cl.$^7$ ...................... H01L 29/12; H01L 31/0256; H01L 29/80; H01L 31/112; H01L 29/76
(52) U.S. Cl. ......................... 257/613; 257/256; 257/289; 438/186
(58) Field of Search ................................. 257/133–136, 257/613, 256, 289; 438/186

(56) References Cited

U.S. PATENT DOCUMENTS

| 4,639,762 | 1/1987 | Neilson et al. | 257/142 |
| 5,378,642 | 1/1995 | Brown et al. | 438/186 |
| 6,091,108 | * 7/2000 | Harris et al. | 257/339 |

FOREIGN PATENT DOCUMENTS

0310047A2  4/1989  (EP) .

OTHER PUBLICATIONS

"Self–aligned 6H–SiC MOSFETs with improved current drive", J.N.Pan et al., Electronics Letters 31, Jul. 1995, No. 14, pp. 1200–1201.
"Aufbau der DMOS–Transistoren", Widman, Mader, Friedrich, Technologie hochintegrierter Schaltungen, Springer Verlag, 1986, pp. 283–285.
Characterization of device parameters in high–temperature metal–oxide–semiconductor field–effect transistors in β–SIC thin films, J.W. Palmour et al., Journal of Applied Physics 64, Aug. 1988, No. 4, Woodbury, New York, pp. 2168–2177.
"High–Voltage Double–Implanted Power MOSFET's in 6H–SiC", Jayrama N. Shenoy et al., IEEE Electron Device Letters, vol. 18, No. 3, Mar. 1997, pp. 93–95.
"4H–silcon carbide power switching devices", J.W. Palmour et al., Proceedings of International Conference on Silicon Carbide and Related Materials, Kyoto, Japan 18 to 21, 1995, pp. 813–816.

* cited by examiner

Primary Examiner—Eddie C. Lee
Assistant Examiner—Allan R. Wilson
(74) Attorney, Agent, or Firm—Herbert L. Lerner; Laurence A. Greenberg; Werner H. Stemer

(57) ABSTRACT

The SiC semiconductor structure contains at least three semiconductor regions. The surface area of the third semiconductor region encompasses that of the second semiconductor region as a second partial area, which in turn encloses the surface of the first semiconductor region as a first partial area. The contour of the edge of the second partial area is determined by the contour of the edge of the first partial area to the effect that the second partial area can be represented essentially as a specially enlarged mapping of the first partial area, the deviation of the contour of the edge of the second partial area from the exact contour that results in the course of the mapping being at most ±10 nm.

12 Claims, 4 Drawing Sheets

SEMICONDUCTOR STRUCTURE BASED ON SILICON CARBIDE MATERIAL, WITH A PLURALITY ELECTRICALLY DIFFERENT PARTIAL REGIONS

CROSS-REFERENCE TO RELATED APPLICATION

This is a continuation of copending International Application PCT/DE98/02108, filed Jul. 27, 1998, which designated the United States.

BACKGROUND OF THE INVENTION

Field of the Invention

The invention lies in the fields of semiconductor technology and manufacture. More specifically, the invention relates to a silicon-carbide material-based semiconductor structure with a plurality of regions with different electrical properties. These include at least a first semiconductor region, a second semiconductor region, the surface of which includes the surface of the first semiconductor region as a first partial area, and a further semiconductor region, whose surface encompasses the surface of the second semiconductor region as a second partial area.

In the case of power semiconductor components, e.g. power MOSFETs (Metal Oxide Semiconductor Field Effect Transistors), particularly high requirements are made of the homogeneity, because many parts, referred to as cells, of these elements are frequently connected in parallel and each cell is intended to contribute the same proportion to the total current.

In the case of a configuration that is known, per se, from silicon technology, namely a vertical MOSFET cell with a so-called lateral channel region, a so-called channel length is defined by the lateral overlap of a base region over a source region of the MOSFET with an opposite conductivity type. In order to obtain a relatively low channel resistance, endeavors are made to minimize the channel length of the MOSFET cell. Furthermore, mass production of components with at least approximately identical properties requires that the channel length be substantially homogeneous across the entire wafer of semiconductor material and that it can be set in a reproducible manner from wafer to wafer.

The article "Self-Aligned 6H-SiC MOSFETs With Improved Current Drive" by J. N. Pan, J. A. Cooper, M. R. Melloch in "Electronics Letters", Jul. 6, 1995, Vol. 31, No 14, pages 1200 and 1201 describes the structure of a lateral MOSFET using silicon carbide technology of the 6H crystal type (6H-SiC) and a method for fabricating it which is based on a method known from silicon technology. Accordingly, adjacent windows in a mask plane represent, within an epitaxially grown, p-doped 6H-SiC layer, in pairs, source and drain regions of the lateral MOSFET which are in each case n-doped by implantated nitrogen ions. However, since distinctly higher temperatures are required for SiC in comparison with silicon for annealing the lattice damage produced during the implantation and for activating the implanted dopants (1200° C.–1500° C. for SiC; 750° C.–800° C. for Si), the use of the MOS system as masking is problematic. In order not to damage the MOS system, heat treatment can be effected only at temperatures of up to a maximum of 1200° C. Consequently, it is not possible to activate the acceptor ions. The channel length is set by way of the distance between the windows in the mask, and the gate oxide and the gate electrode are situated in a self-aligned manner above the inversion channel. The method cannot be applied to those types of components in which a channel region is implanted, because for that purpose a p-type doping is necessary either for the source and drain or for the channel region. The maximum possible annealing temperature of 1200° C. does not suffice, however, for annealing and activating the acceptor ions.

The article "4H-Silicon Carbide Power Switching Devices" by J. W. Palmour, et al. in "Technical digest of International conference on SiC and related materials", Kyoto, Japan, 1995, pages 813–16 describes a non-planar UMOS structure in silicon carbide of the 4H crystal type. The source regions are produced by the implantation of donor ions into an epitaxially grown p-doped SiC layer. By means of reactive ion etching (RIE), aligned in each case with the center of the source regions, a U-shaped trench is opened in the surface of the semiconductor structure. The trenches each extend down into the n-doped SiC layer arranged under the p-doped SiC layer and successively accommodate the gate oxide and the gate electrode. The channel length is defined by the thickness, of the p-doped SiC layer, which remains in the vertical direction between the source region and the n-doped SiC layer. Just a single implantation step is provided in that process as well. The channel length is controlled by way of the penetration depth of the nitrogen ions and the thickness of the p-doped SiC layer.

In the case of the SiC semiconductor structures which are known as $DI^2$-MOSFETs (see, for example, "IEEE Electron Device Letters", by J. N. Shenoy et al., Vol 18, No 3, March 1997, pages 93–95) and have a plurality of mutually enclosing surface regions, the distances between the edges of the mutually enclosing surface regions—the distances defining the lateral channel lengths—are comparatively non-uniform when considered over the entire periphery of a respective partial region. In other words, the distances between adjacent edges fluctuate by an order of magnitude of distinctly more than 50 nm. It is then shown, however, that, for instance in the case of many partial regions of a corresponding structure being connected in parallel, the partial regions are locally loaded to different extents in electrical terms and thus non-uniformly in thermal terms. Consequently, the advantages of a high loading capability in the application of SiC material are correspondingly reduced because of the requirement for avoiding the overloading of individual partial regions.

SUMMARY OF THE INVENTION

It is accordingly an object of the invention to provide a silicon-carbide based semiconductor structure with several electrically distinct partial regions, which overcomes the above-mentioned disadvantages of the heretofore-known devices and methods of this general type and which ensures a high loading capability particularly in the case in which many partial regions are connected in parallel.

With the foregoing and other objects in view there is provided, in accordance with the invention, an SiC semiconductor structure, comprising:

a first semiconductor region having a surface area;

a second semiconductor region having a surface area encompassing the surface of the first semiconductor region as a first partial area;

a further semiconductor region having a surface area encompassing the surface of the second semiconductor region as a second partial area;

the first partial area having an edge with a predetermined contour; and the second partial area having an edge with a contour determined by the predetermined contour of the edge of the first partial area such that a plurality of equi-radial circles imaginarily described around each point of the edge of the first partial area and assigned a common outer envelope defines the contour of an imaginary exact edge of the second partial area, whereby an actual edge of the second partial area is spaced at most ±10 nm from the exact edge.

In accordance with an added feature of the invention, the first, second, and further semiconductor regions have mutually different electrical properties.

In other words, the object of the invention is satisfied in that the contour of the edge of the first partial area is predetermined, and that the contour of the edge of the second partial area is determined by the contour of the edge of the first partial area to the effect that a circle having the same radius is imaginarily described around each point of the edge of the first partial area and all the circles are assigned a common outer envelope which defines the contour of an imaginary exact edge of the second partial area, the actual edge of the second partial area being at a distance at most of ±10 nm from the exact edge.

This is based on the fact that the lateral distances between the edges of mutually enclosing partial regions determine the electrical properties of the semiconductor structure. Only lateral distances with very close tolerances advantageously allow a generally uniform, high electrical and/or thermal loading of the so-called lateral channels which run between the edges, where the corresponding tolerances of the channel lengths are permitted to be no more than ±10 nm. The realization of such partial regions is advantageously achieved by virtue of the fact that the edge contour of the innermost partial region is defined as the determinant one and then at least the edge contour of the larger partial region which includes this innermost region is produced by methods which are known per se. For edges further out, the contour of the respectively enclosed edge should then be regarded as the "innermost" contour according to the invention.

In accordance with an additional feature of the invention, the further semiconductor region is defined as a third semiconductor region and it is contained in a fourth semiconductor region encompassing it. The third semiconductor region is thereby a partial region of the fourth region and it has an edge enclosing the edge of the second semiconductor region at a spacing distance.

In accordance with another feature of the invention, the third semiconductor region is formed by a centrically extended mapping of the second semiconductor region, with the inclusion of a deviation of at most ±10 nm.

In accordance with a further feature of the invention, the above-noted further semiconductor region encompasses at least two second semiconductor regions, each enclosing the first semiconductor region.

In other words, the semiconductor structure according to the invention may preferably have a further semiconductor region containing at least two second semiconductor regions, which each encompass a first semiconductor region. The second semiconductor regions with the first semiconductor regions that they respectively enclose then represent standard cells with, for example, an identical structure which can advantageously be connected in parallel.

The further semiconductor region may constitute, in particular, a third semiconductor region, which is in turn a partial region of a fourth semiconductor region and the edge of which encloses at a distance the edge of the second semiconductor region. In this case, it is possible preferably to adhere to the same standpoints of spacing apart as are intended to be provided according to the invention between the edge of the first partial region and that of the second partial region.

In accordance with again a further feature of the invention, the surfaces of the first semiconductor region, of the second semiconductor region, and of the further semiconductor region lie in a common plane.

In accordance with a concomitant feature of the invention, the edge of the second partial area is spaced a distance of between 50 nm and 300 nm from the edge of the first partial surface area.

The semiconductor structure according to the invention may be designed, in particular, as a MISFET structure, preferably as a MOSFET structure, or as a JFET structure or as a MESFET structure or as an IGBT structure. Such structures are distinguished by a high current loading capability, in particular during switching operations.

Other features which are considered as characteristic for the invention are set forth in the appended claims.

Although the invention is illustrated and described herein as embodied in a semiconductor structure based on silicon carbide material, with a plurality of electrically different partial regions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Structurally and functionally corresponding parts are identified with the same reference symbols throughout the figures.

DESCRIPTION OF THE PREFERRED EMBODIMENTS

The semiconductor structure according to the invention is placed on embodiments known per se using SiC technology (see, for example, U.S. Pat. No. 5,378,642), which can be fabricated by methods that are known in the art. A particularly advantageous method is disclosed in our commonly assigned German patent application No. 197 33 068.1, filed concurrently with the instant application, entitled "Method for Patterning Semiconductors With High Precision, Good Homogeneity and Reproducibility."

Figure 1:
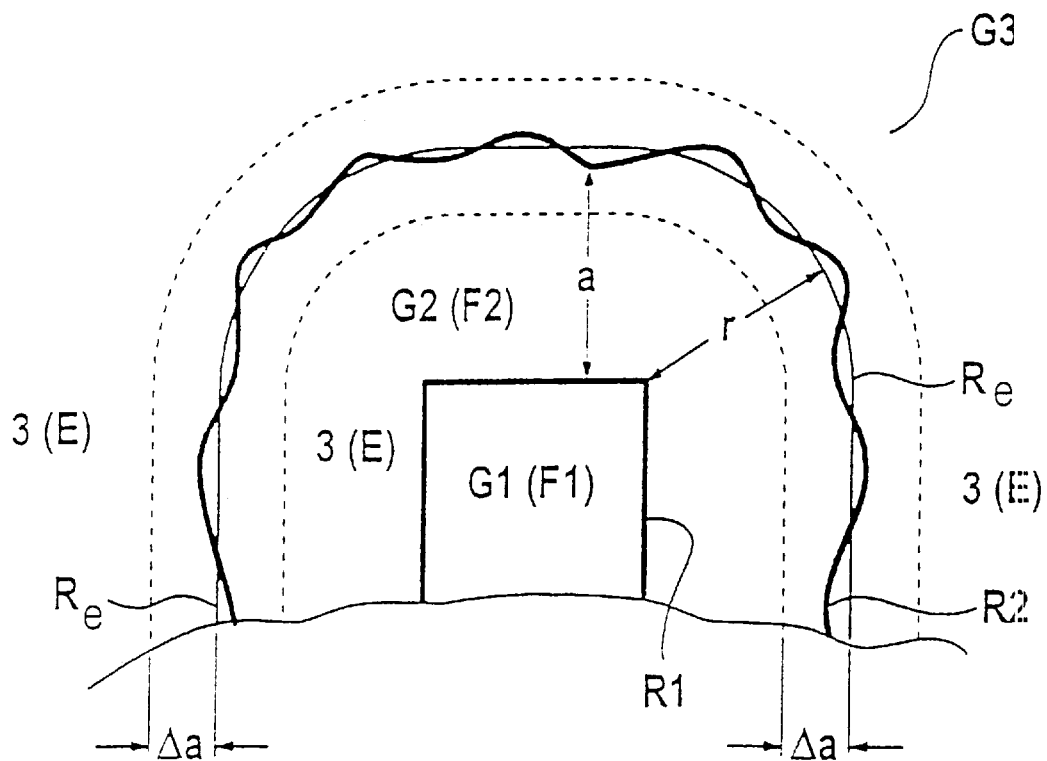
FIG. 1 is a plan view of a detail of a surface of a semiconductor structure according to the invention with a single standard cell.

Referring now to the figures of the drawing in detail and first, particularly, to FIG. 1 thereof, there is seen a plan view of a detail of an SiC semiconductor structure according to the invention. The structure, which is designated generally by 2, has a first semiconductor region G1 that is intended to be determinant, from its configuration, at least for a second semiconductor region G2. The semiconductor regions differ with regard to their electrical properties. From its position, the first semiconductor region G1 is to be regarded as an innermost region of the structure which lies within the second semiconductor region G2 and forms with the latter a common surface 3 in a common plane E. Its edge R1 has a predetermined contour and includes a first partial area F1 of the surface. The partial area F1 has an inherently arbitrary shape. Preferably, the partial area may be at least approximately hexagonal, triangular, rectangular or circular. The edge R2 of the second semiconductor region G2 bounds a second partial area F2.

Figure 2:
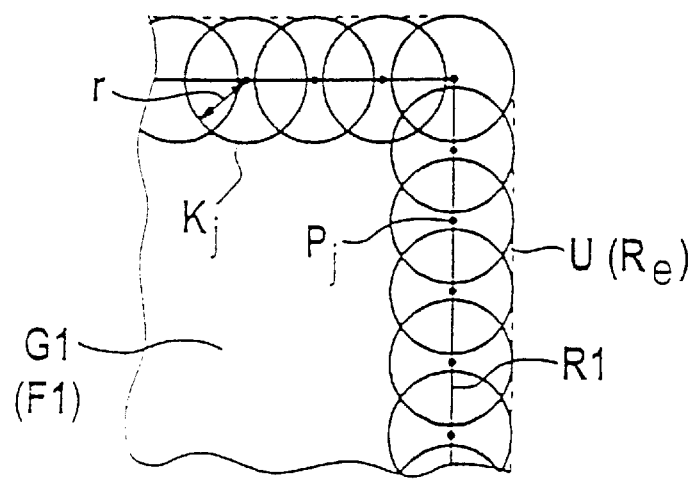
FIG. 2 is a corresponding plan view of a detail from the standard cell.

Referring now to FIG. 2, there is illustrated, in a detail, the way in which the contour of the edge R2 of the second partial area F2 is intended to be defined by the contour of the edge R1 of the first partial area F1. This is based on the mathematical concept that a circle $K_j$ with a constant radius R is described around each point of the edge R1 of the first partial area F1 as the center. For the sake of better clarity, only a few points are indicated and designated by $P_j$ in FIG. 2. All the circles have a common outer envelope U, which is indicated by a dashed line. In this case, this mathematical construction of the outer envelope U advantageously corresponds at least largely to the specific design of an etching front moving outward from the inner edge R1. The contour of the envelope U represents the contour of an imaginary exact edge, which is designated by $R_e$ in FIG. 1. A deviation Δa of the contour of the edge R2 of the second partial area F2 from this contour of the exact edge $R_e$ should thereby be no more than ±10 nm. In this way, it can advantageously be ensured that a distance a between the edge R1 of the first partial area and the edge R2 of the second partial area F2 is constant, except for the deviation ±Δa, in the entire region extending between the edges R1 and R2. This distance a essentially determines the electrical properties of the semiconductor structure. It represents a channel length in the case of FET components. A corresponding component with channel lengths a being taken as a basis shall be assumed for the explanations below, although the corresponding measures according to the invention can also be applied to other types of components. The effective (actual) channel length a is generally of the order of magnitude of between 50 and 5000 nm, preferably between 1000 and 2000 nm in the case of MOSFETs. The current distribution of a current flowing in this region is homogeneous in accordance with the constancy of the channel length a; the consequence of this is that the electrical losses are locally distributed correspondingly uniformly. This advantageously results in correspondingly uniform thermal loading of the semiconductor structure according to the invention.

FIG. 1 also indicates a further semiconductor region G3, which is formed for example by the area of an SiC wafer. In this case, the area of the semiconductor region G3 contains the area F2 of the second semiconductor region G2. The individual semiconductor regions G1 to G3 with their surfaces lying in the common plane E differ in a known manner in terms of their electrical properties (for example on account of different dopings).

It goes without saying that the semiconductor region G3 may in turn be a partial region of a larger semiconductor region G4 that encloses it. In this case, the contour of the edge R2 defines the contour of the edge of this third semiconductor region G3. In this case, it is possible preferably to adhere to the same conditions with regard to the spacing distances of the edges as are intended to be adhered to according to the invention for the spacing distance of the edge R2 with regard to the inner edge R1. If it is assumed that an (actual) channel length from edge to edge of the partial areas of two mutually enclosing semiconductor regions is set uniformly within the scope of an accuracy of 10 nm, then, for n mutually enclosing partial regions, the actual channel length between the $(n-1)^{th}$ and $n^{th}$ partial regions deviates no more than $[(n-1) * 10]$ nm from the effective channel length a between the edges R1 and R2.

Figure 3:
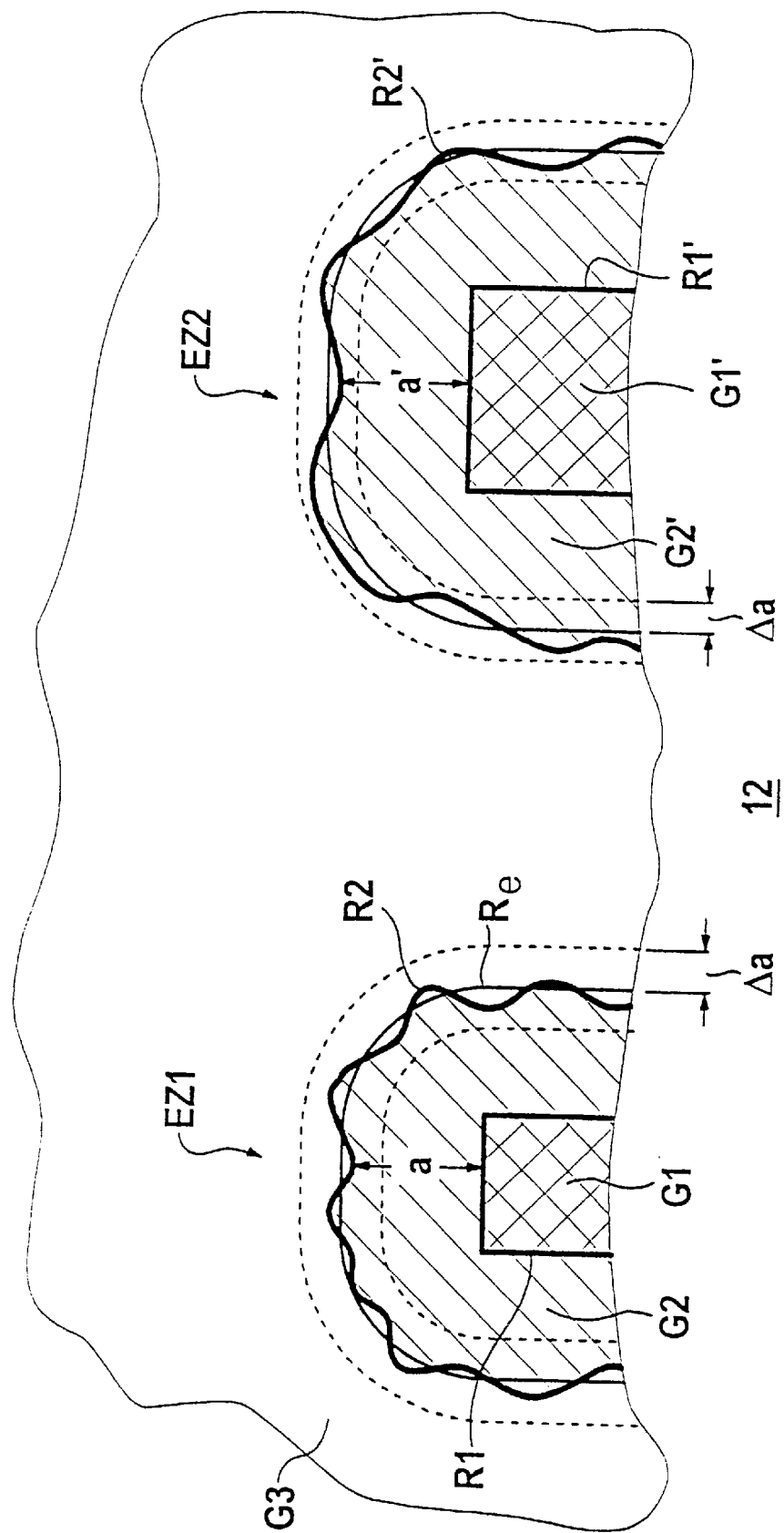
FIG. 3 is a plan view of a detail of a semiconductor structure with two standard cells.

In FIG. 1, it was assumed that the semiconductor structure 2 according to the invention has merely a single standard cell formed by the mutually enclosing partial regions G1 and G2. In general, however, a plurality of such standard cells are provided for a semiconductor structure according to the invention and can, in particular, be connected in parallel. Reference is had to FIG. 3 which shows, in an illustration corresponding to FIG. 1, a semiconductor structure 12 with two such standard cells EZ1 and EZ2. The two standard cells are each constructed in accordance with the standard cell shown in FIG. 1, the parts assigned to the standard cell EZ2 in each case being specially identified by an additional prime symbol in the figure. Since as far as possible identical electrical and thus thermal loading is desirable in the case of the standard cells being connected in parallel, the standard cells EZ1 and EZ2 should have an at least largely identical construction. Therefore, in an advantageous manner, the innermost partial regions G1 and G1' of the two standard cells are designed to be substantially identical. The edges R2 and R2' of the two standard cells are then spaced apart to the same extent, within the predetermined tolerance, with regard to the edges R1 and $R_1$, respectively, that they surround, the edges appertaining to the innermost partial regions G1 and G1', respectively. Deviating from this, the situation whereby the innermost partial regions G1 and G1' have a different size or area is assumed in the illustration in FIG. 3. If, proceeding from these partial regions, the corresponding edges R2 and R2' are then produced in the same etching process, channel lengths a and a', respectively, which are at least approximately of the same magnitude are produced.

It goes without saying that in this embodiment of a semiconductor structure 12 as well, each individual cell may have a plurality of mutually enclosing partial regions.

Figure 4:
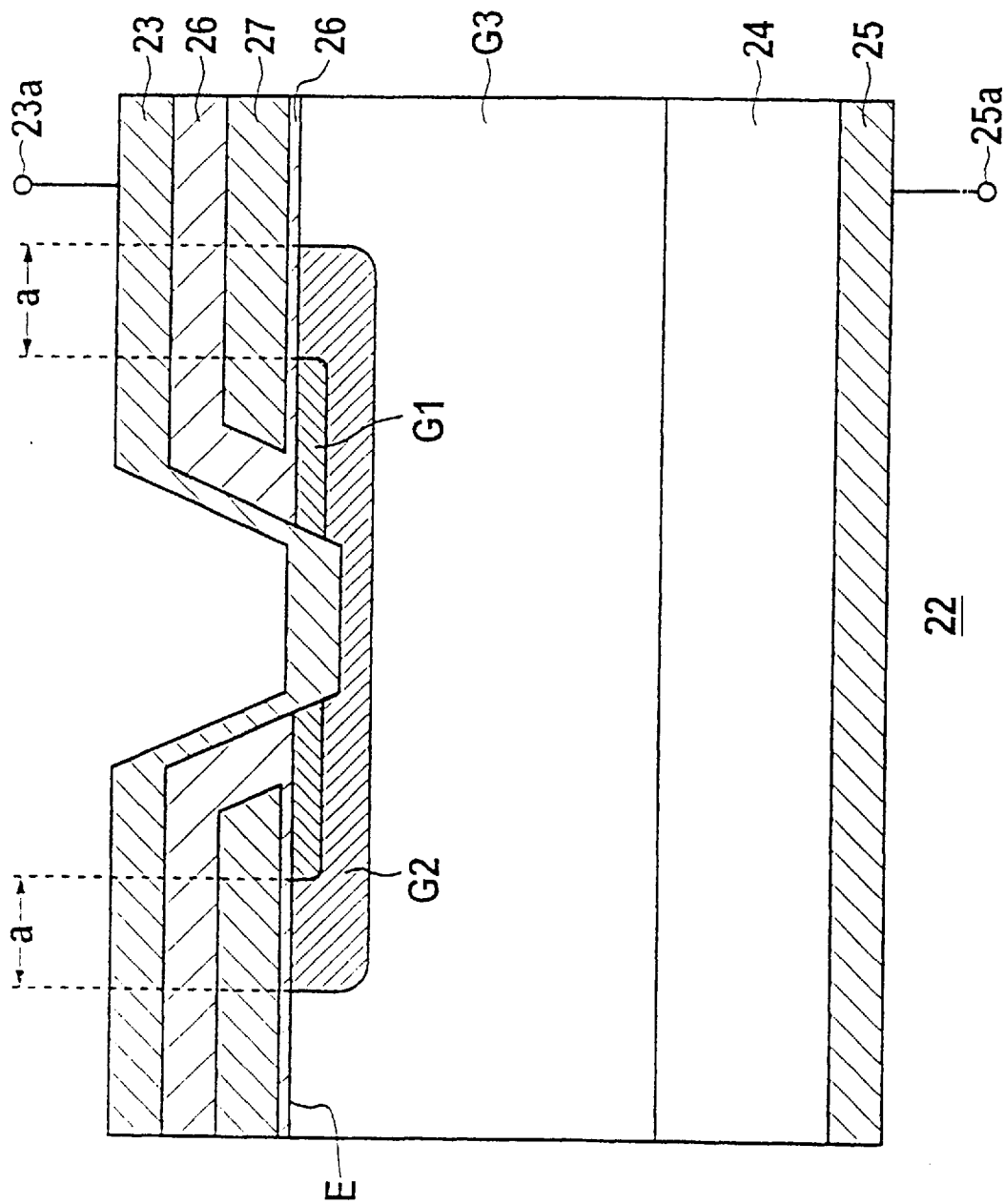
FIG. 4 is a vertical section taken through a semiconductor structure configured as a vertical MOSFET.

Referring now to FIG. 4, there is shown a section through a semiconductor structure 22 representing a detail in the form of a cell of a vertical MOSFET with a lateral channel region. A MOSFET generally has a plurality of such cells. Contact is made with a first semiconductor region G1 forming a source region, for instance a so-called $n^+$-type source well, and with a second semiconductor region G2 forming a base region, for instance the so-called p-type well, by means of a V-shaped source metallization layer 23. The latter is led through the first semiconductor region G1 into the second semiconductor region G2 and is connected via a source contact 23a. The active region of the components shown is situated in that zone of the second semiconductor region G2 which is near the surface. The lateral overhang of the second semiconductor region G2 on every side beyond the first semiconductor region G1 in this case corresponds to a channel length a of the MOSFET.

In FIG. 4, furthermore, a third (further) semiconductor region which accommodates the second semiconductor region G2 with the central semiconductor region G1 and is formed e.g. by a so-called $n^-$-type epitaxial layer is designated by G3. The substrate, for example $n^+$-doped, carrying the third semiconductor region is designated by 24. A drain layer attached to the substrate 24 is designated by 25 with drain contact 25a, and a gate electrode which is situated in an insulation 26 and encompasses the semiconductor regions G1 and G2 in field terms is designated by 27.

Figure 5:
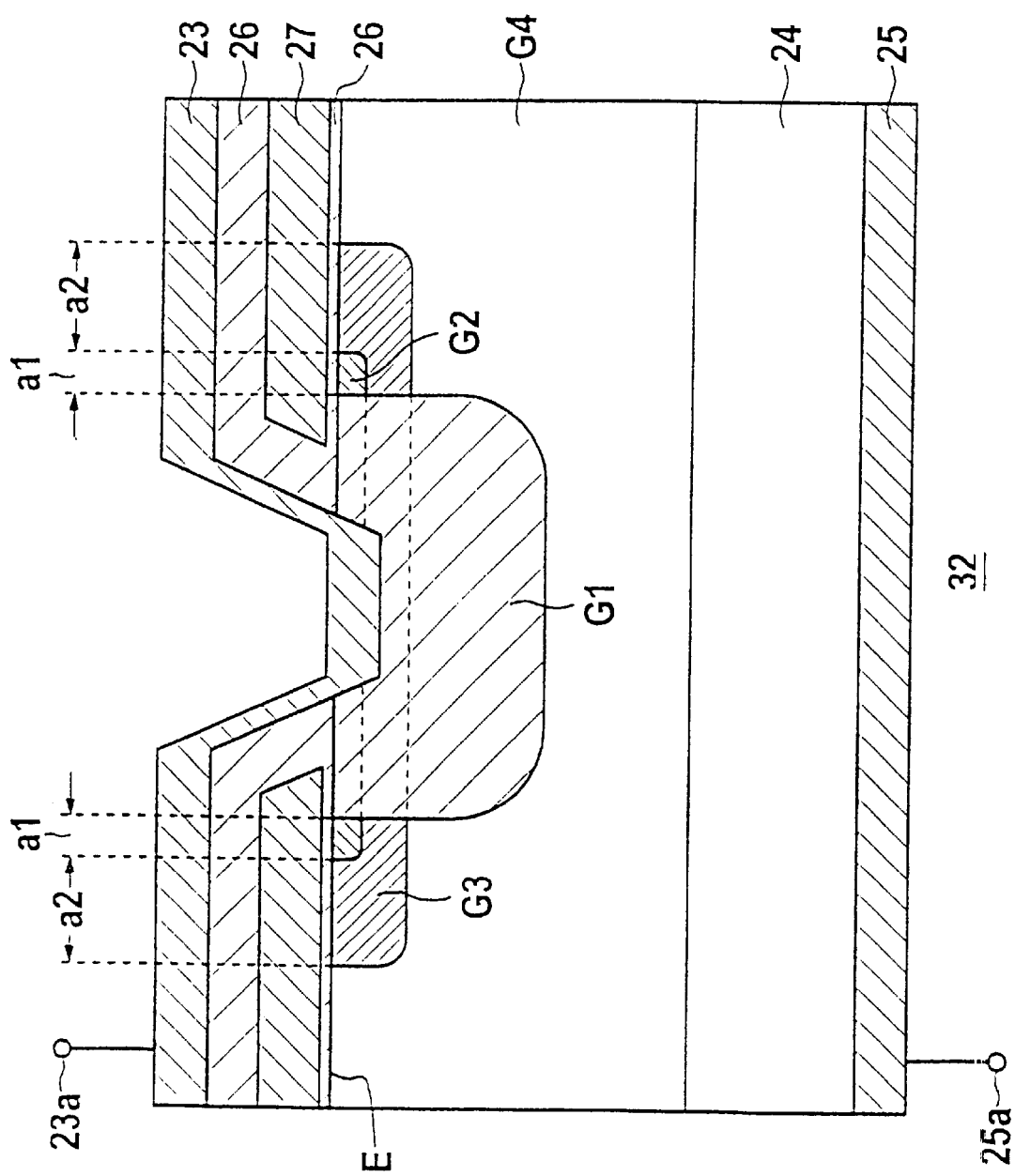
FIG. 5 is a vertical section through a particular configuration of the MOSFET structure of FIG. 4.

FIG. 5 shows, in an illustration corresponding to FIG. 4 as a semiconductor structure 32 according to the invention, a further embodiment of a MOSFET structure with an additional p$^+$-type well for increasing the blocking ability. The well constitutes a central, inner semiconductor region G1 surrounded by regions G2 (n$^+$-type source well) and G3 (p$^-$-type well), which essentially corresponds to the regions G1 and G2 in FIG. 4, with regard to their surfaces lying in a common plane E. In this case, the lateral distance between the edges of the regions G1 and G2 is designated by a1. This source-gate overlap represents a resistive section, for example, which can advantageously be made particularly small on account of the small tolerances according to the invention. By contrast, the distance between the edges of the regions G2 and G3 which is designated by a2 represents a channel length. The distances a1 and a2 consequently have a different magnitude. The semiconductor region which accommodates these regions G1 to G3, in the form of an n$^-$-type epitaxial layer which is again situated on an n$^+$-type substrate 24, is designated by G4.

A semiconductor structure of a JFET type or of a MESFET type or of an IGBT type may also be configured in a corresponding manner.

Over and above the possibilities, indicated with reference to the figures, for designing semiconductor structures according to the invention, it goes without saying that other embodiments of components using SiC technology are also possible, which have at least one inner, central semiconductor region situated within a second semiconductor region, and of which a high loading capability is demanded.

We claim:

1. An SiC semiconductor structure, comprising:

a first semiconductor region having a surface area;

a second semiconductor region having a surface area encompassing said surface of said first semiconductor region as a first partial area;

a further semiconductor region having a surface area encompassing said surface of said second semiconductor region as a second partial area;

said first partial area having an edge with a predetermined contour; and said second partial area having an edge with a contour determined by said predetermined contour of said edge of said first partial area such that a plurality of equi-radial circles imaginarily described around each point of said edge of said first partial area and assigned a common outer envelope defines said contour of an imaginary exact edge of said second partial area, whereby an actual edge of said second partial area is spaced at most ±10 nm from said exact edge.

2. The structure according to claim 1, wherein said first, second, and further semiconductor regions have mutually different electrical properties.

3. The structure according to claim 1, wherein said further semiconductor region is a third semiconductor region, and including a fourth semiconductor region encompassing said third semiconductor region as a partial region and having an edge enclosing said edge of said second semiconductor region at a spacing distance.

4. The structure according to claim 3, wherein said third semiconductor region is formed by a centrically extended mapping of said second semiconductor region, with the inclusion of a deviation of at most ±10 nm.

5. The structure according to claim 1, wherein said further semiconductor region encompasses at least two second semiconductor regions, each enclosing said first semiconductor region.

6. The structure according to claim 1, wherein said surfaces of said first semiconductor region, of said second semiconductor region, and of said further semiconductor region lie in a common plane.

7. The structure according to claim 1, wherein said edge of said second partial area is spaced a distance of between 50 nm and 300 nm from said edge of said first partial area.

8. The structure according to claim 1, wherein said first, second, and further semiconductor regions form a part of a MISFET structure.

9. The structure according to claim 1, wherein said first, second, and further semiconductor regions form a part of a MOSFET structure.

10. The structure according to claim 1, wherein said first, second, and further semiconductor regions form a part of a JFET structure.

11. The structure according to claim 1, wherein said first, second, and further semiconductor regions form a part of a MESFET structure.

12. The structure according to claim 1, wherein said first, second, and further semiconductor regions form a part of an IGBT structure.

* * * * *